United States Patent
Wu et al.

(10) Patent No.: US 9,256,578 B2
(45) Date of Patent: Feb. 9, 2016

(54) METHOD AND APPARATUS FOR MEASURING AND RECOVERING SPARSE SIGNALS

(75) Inventors: Keying Wu, Shanghai (CN); Xiaoyong Guo, Shanghai (CN)

(73) Assignee: Alcatel Lucent, Boulogne-Billancourt (FR)

( * ) Notice: Subject to any disclaimer, the term of this patent is extended or adjusted under 35 U.S.C. 154(b) by 386 days.

(21) Appl. No.: 13/880,646

(22) PCT Filed: Jan. 10, 2011

(86) PCT No.: PCT/CN2011/070158
§ 371 (c)(1),
(2), (4) Date: Apr. 19, 2013

(87) PCT Pub. No.: WO2012/094804
PCT Pub. Date: Jul. 19, 2012

(65) Prior Publication Data
US 2013/0289942 A1 Oct. 31, 2013

(51) Int. Cl.
*H03F 1/26* (2006.01)
*G06F 17/16* (2006.01)
*H03M 7/30* (2006.01)

(52) U.S. Cl.
CPC ............. *G06F 17/16* (2013.01); *H03M 7/3062* (2013.01)

(58) Field of Classification Search
CPC ... G03F 17/16; H03M 7/3062; H03M 1/1245; G06K 9/6245; G10L 21/0272; G10L 15/20; G10L 2021/02165
USPC .................. 702/189, 190, 196; 375/232, 377; 341/50, 87, 118
See application file for complete search history.

(56) References Cited

U.S. PATENT DOCUMENTS

| 7,345,603 B1 | 3/2008 | Wood et al. |
| 8,711,015 B2 * | 4/2014 | Mustiere ................ H03M 7/30 |
| | | 341/87 |

(Continued)

FOREIGN PATENT DOCUMENTS

| CN | 101640541 | 2/2010 |
| CN | 101742313 | 6/2010 |

(Continued)

OTHER PUBLICATIONS

Wu, Keying et al; Compressive Sensing of Digital Sparse Signals; IEEE WCN 2011—PHY; 978-1-61284-254-7/11; 2011 IEEE; pp. 1488-1492.

(Continued)

*Primary Examiner* — An Do
(74) *Attorney, Agent, or Firm* — Patti & Malvone Law Group, LLC

(57) ABSTRACT

The invention provides two kinds of new compressive sensing technologies. In the first technical solution, there is proposed a permutation-based multi-dimensional sensing matrix and an iterative recovery algorithm with maximum likelihood (ML) local detection, which can fully exploit the digital nature of sparse signals. In the second technical solution, there is proposed a sparse measurement matrix which contains a permutation-based multi-dimensional measurement matrix, and an iterative recovery algorithm which fully utilizes the features of measurement symbols to design simple local recovery in each iteration. The second technical solution can achieve the linear decoding complexity and lower bound of sketch length empirically at the same time.

14 Claims, 4 Drawing Sheets

(56) References Cited

U.S. PATENT DOCUMENTS

| | | | | |
|---|---|---|---|---|
| 8,879,672 B2* | 11/2014 | Jung | ............ | H03M 7/3062 375/224 |
| 2007/0122041 A1* | 5/2007 | Moghaddam | ........ | G60K 9/6234 382/224 |
| 2010/0246920 A1 | 9/2010 | Vaswani | | |

FOREIGN PATENT DOCUMENTS

| CN | 101895297 | 11/2010 |
|---|---|---|
| CN | 101908889 | 12/2010 |
| WO | 2010026514 | 3/2010 |
| WO | 2010049906 | 5/2010 |

OTHER PUBLICATIONS

Wakin, M. B. et al; Concentration of Measure for Block Diagonal Measurement Matrices; Acoustics Speech and Signal Processing 2010 IEEE International Conference; ICASSP 2010; 978-1-4244-4296-6/10; 2010 IEEE; pp. 3614-3617.

* cited by examiner

METHOD AND APPARATUS FOR MEASURING AND RECOVERING SPARSE SIGNALS

FIELD OF THE INVENTION

The application relates to compressive sensing technology.

BACKGROUND OF THE INVENTION

Compressive sensing (CS) is a recently developed technique. Considering the fact that a large part of natural and artificial signals have the sparse or near sparse property, the compressive sensing technique can find applications in many different areas like compressive imaging, compressive sampling, signal processing, data stream computing, and combinatorial group testing, etc. The basic idea of compressive sensing is that a sparse signal x (a signal is referred to as sparse if it contains much more zero elements than non-zero elements) with length-N can be accurately recovered from a linear measurement y=Ax of length-M, wherein A is the M×N measurement matrix, M<<N.

The reconstruction can be performed through minimizing $\|x\|_0$ that explains the measurement vector. As this minimization problem is NP hard, sub-optimal algorithms have been investigated. Major classes of computationally feasible sparse signal recovery algorithms include convex relaxation, which approximates the $l_0$ minimization problem by an $l_p$ minimization problem with p often chosen as 1 and solves this problem using convex optimization; matching pursuit, which iteratively refines a sparse solution by successively identifying one or more components that yield the greatest quality improvement; and Bayesian framework, which assumes a priori distribution that favors sparsity for the signal vector, and uses a maximum a posteriori estimator to incorporate the observation. Despite their relatively good performance in practice, they are most suitable for signals with continuous values. For sparse signals with digital values, e.g., when dealing with monochrome images, these algorithms are less sufficient as they cannot exploit the digital nature of the source, which, if utilized properly, can greatly enhance the recovery accuracy.

Therefore, there is a need of a new compressive sensing technique that can fully exploit the digital nature of signals.

In addition, in almost all applications, it is preferred that the measurement matrix A is sparse, i.e., it contains much more zero entries than non-zero entries in each column. The advantages of sparse measurement matrices include low computational complexity in both encoding and decoding, easy incremental updates to signals, and low storage requirement, etc. Much research has been devoted to CS with sparse measurement matrices, but most of them fail to achieve the linear decoding complexity and performance bound at the same time. Typical examples of existing algorithms include matching pursuit and convex optimization. The matching pursuit type of algorithms can asymptotically achieve the lower bound of the sketch length with a linear recovery complexity. However, numerical results have shown that the empirical sketch lengths needed in this type of algorithms are always much higher than the asymptotic bound. The convex optimization type of algorithms, on the other hand, can achieve the lower bound of the sketch length both asymptotically and empirically, which indicates an advantage in terms of measurement number in practices. For example, with the number of non-zero elements K=50 and signal length N=20000, it was shown that matching pursuit needs about 2000 measurements while convex optimization needs only about 450 measurements. One major disadvantage of the convex optimization type of algorithms is their higher recovery complexity, which grows in a polynomial order with the signal length N as $O(N^3)$.

Therefore, there is a need of a new compressive sensing technique that can achieve the linear decoding complexity and lower bound of sketch length empirically at the same time, with sparse measurement matrices.

OBJECT AND SUMMARY OF THE INVENTION

To better address above two concerns, there are provided two technical solutions, one is to provide a new compressive sensing technique that can fully exploit the digital nature of sparse signals, and the other is to provide a new compressive sensing technique that can achieve the linear decoding complexity and lower bound of sketch length empirically at the same time with sparse measurement matrices.

Based thereon, in a first aspect of the invention, there is provided a method for processing digital sparse signals. The method comprises the step of: performing a linear measurement to a length-N sparse signal vector $x=\{x_i\}$ with a M×N measurement matrix A to obtain a length-M measurement vector y, wherein the measurement matrix A is denoted by:

$$A = \begin{bmatrix} A_1 \Pi_1 \\ \vdots \\ A_d \Pi_d \\ \vdots \\ A_D \Pi_D \end{bmatrix}$$

wherein $A_d \Pi_d$ is a sub-matrix of the measurement matrix A, for d=1~D, $\Pi_d$ is a N×N random permutation matrix, and $A_d$ is an J×N matrix which is denoted by:

$$A_d = \begin{bmatrix} a_{1,1}^{(d)} \dots a_{1,L}^{(d)} & & 0 \\ & \ddots & \\ 0 & & a_{J,1}^{(d)} \dots a_{J,L}^{(d)} \end{bmatrix}$$

wherein M<<N, J*L=N and each entry $x_i$ in the sparse signal vector x is taken from a finite set $Q=\{X_0=0, X_1, \ldots, X_{Q-1}\}$ with $X_q$ a non-zero figure for q=1~Q−1, and Q the size of the set, wherein the measurement symbols generated from the same permutation matrix are referred to as one dimension, and the D is the total dimension number.

Advantageously, the method may further comprise the steps of: using D maximum likelihood detectors to respectively perform maximum likelihood detection for D dimensions, wherein the dth maximum likelihood detector is used for performing maximum likelihood detection for the dth dimension; repeating above step for a plurality of iterations until a predetermined condition is satisfied; and estimating the source symbols in the sparse signal vector based on the output of the Dth maximum likelihood detector in the last iteration.

The measurement matrix A in the first aspect of the invention allows simple maximum likelihood detection in each dimension, which fully exploits the digital nature of sparse signals and provides a computationally feasible locally optimal detection for each dimension. The multi-dimensional structure of measurement matrix enables iterative information exchange between dimensions to get a near global-optimal estimation result.

Furthermore, the measurement matrix A in the first aspect of the invention is sparse, i.e., it contains much more zero entries than non-zero entries in each column. The sparsity of measurement matrix has several attractive properties, like low computational complexity in both encoding and recovery, easy incremental updates to signals and low storage requirements, etc. These advantages make the technical solution in the first aspect of the invention a potential and practical solution to compressive sensing with sparse digital signals.

In a second aspect of the invention, there is provided a method for processing analog sparse signals. The method comprises the step of: performing a linear measurement to a length-N K-sparse signal vector x with a M×N measurement matrix A to obtain a length-M measurement vector y, wherein the measurement matrix A is denoted by:

$$A = \begin{bmatrix} A_1 \Pi_1 \\ \vdots \\ A_d \Pi_d \\ \vdots \\ A_D \Pi_D \end{bmatrix}$$

wherein $A_d \Pi_d$ is a sub-matrix of the measurement matrix A, for d=1~D, $\Pi_d$ is a N×N random permutation matrix, and $A_d$ is an J×N matrix which is denoted by:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix}$$

wherein K<<N, M<<N, J*L=N and the sparse signal vector $x=\{x_i\} \in \Re^N$, wherein the measurement symbols generated from the same permutation matrix are referred to as one dimension, and the D is the total dimension number.

Advantageously, the method may further comprise the steps of:

i. for each element $\tilde{y}_j^{(d)}$ in $\tilde{y}$, for d≤1~D, j=1~J, judging whether the $\tilde{y}_j^{(d)}$ equals to 0, wherein $\tilde{y}$ is initialized as $\tilde{y}=y$, and $\tilde{y}_j^{(d)}$ is the jth element in the dth dimension of $\tilde{y}$;

ii. if the $\tilde{y}_j^{(d)}$ equals to 0, setting $x_{\Pi_d^{-1}((j-1)L+l)}=0$, for l=1~L; wherein $\Pi_d(i)$ is the index of $x_i$ in the dth permuted version and $\Pi_d^{-1}(i)$ the inverse operation of $\Pi_d(i)$;

and the method further comprises the steps of:

u. for each source symbol $x_i$ in the sparse signal vector x, for i=1~N, judging whether the following equation is satisfied, $$\frac{\tilde{y}_{j_i^{(d_m)}}^{(d_m)}}{a_{j_i^{(d_m)},l_i^{(d_m)}}^{(d_m)}} = \frac{\tilde{y}_{j_i^{(d_n)}}^{(d_n)}}{a_{j_i^{(d_n)},l_i^{(d_n)}}^{(d_n)}}, \forall d_m = 1 \sim D, d_n = 1 \sim D, d_m \neq d_n;$$

v. if it is satisfied for a pair of $(d_m, d_n)$, setting $$x_i = \frac{\tilde{y}_{j_i^{(d_m)}}^{(d_m)}}{a_{j_i^{(d_m)},l_i^{(d_m)}}^{(d_m)}};$$

wherein $j_i^{(d_m)}=\lfloor (\Pi_{d_m}(i)-1)/L \rfloor$ and $l_i^{(d_m)}=\text{mod}(\Pi_{d_m}(i)-1, L)+1$.

and after above steps, the method further comprises:

p. updating $\tilde{y}$ by subtracting the recovered sparse signals from the measurement vector y, by following formula:

$$\tilde{y}=y-A\tilde{x}$$

wherein $\tilde{x}$ represents the recovered sparse signal vector, in which the un-recovered symbols are set to 0;

q. repeating above steps for a plurality of iterations until a predetermined condition is satisfied.

The special structure of the measurement matrix A in the second aspect of the invention leads to some interesting features of the measurement symbols, as will be explained later, which can be exploited to design a very simple recovery algorithm in each iteration. An iterative process is used to recover the source signal step by step, starting with symbols easier to recover, and canceling the contributions of already-recovered symbols to facilitate the recovery of other symbols. By repeating such a detection and cancellation operation, a near global-optimal solution can be obtained. The complexity needed grows only linearly with the source signal length N. The multi-dimensional structure and the random permutation matrices guarantee that each measurement statistically provides (directly or indirectly) some useful information to all source symbols, which is crucial for the good performance of the proposed technique.

Furthermore, the technical solution in the second aspect of the invention can achieve the empirical sketch length lower bound and linear complexity at the same time. The good empirical performance and low complexity makes it a good and practical alternative solution to compressive sensing with sparse measurement matrices.

In addition, according to one embodiment of the invention, there is provided an apparatus for measuring and recovering sparse signals comprising: a measuring means, for performing a linear measurement to a length-N sparse signal vector $x=\{x_i\}$ with a M×N measurement matrix A to obtain a length-M measurement vector y, wherein the measurement matrix A is denoted by:

$$A = \begin{bmatrix} A_1 \Pi_1 \\ \vdots \\ A_d \Pi_d \\ \vdots \\ A_D \Pi_D \end{bmatrix}$$

wherein $A_d \Pi_d$ is a sub-matrix of the measurement matrix A, for d=1~D, $\Pi_d$ is a N×N random permutation matrix, and $A_d$ is an J×N matrix which is denoted by:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix}$$

wherein M<<N, J*L=N, the measurement symbols generated from the same permutation matrix are referred to as one dimension, and the D is the total dimension number; and a recovering means, for recovering the length-N sparse signal vector $x=\{x_i\}$ from the length-M measurement vector y.

BRIEF DESCRIPTION OF THE DRAWINGS

The invention is explained in further detail, and by way of example, with reference to the accompanying drawings wherein.

Throughout the above drawings, like reference numerals will be understood to refer to like, similar or corresponding features or functions.

DETAILED DESCRIPTION

Hereinafter, the technical solution of the above first aspect of the invention and the technical solution of the above second aspect of the invention will be described respectively in great detail.

Figure 1:
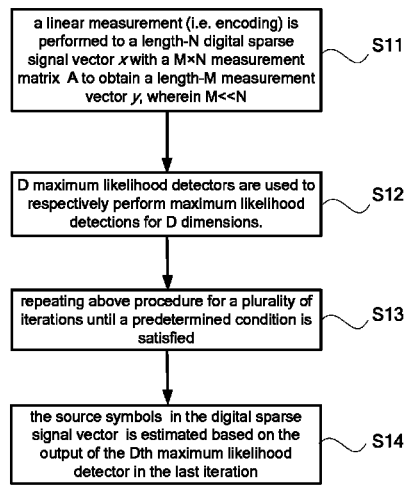
FIG. 1 shows a flowchart of processing digital sparse signals according to one embodiment.

FIG. 1 shows a flowchart of processing digital sparse signals according to one embodiment.

In Step S11, a linear measurement (i.e. encoding) is performed to a length-N digital sparse signal vector x with a M×N measurement matrix A to obtain a length-M measurement vector y, wherein M<<N.

Consider digital sparse signal vector $x=\{x_i\}$ with independent and identically distributed (i.i.d.) entries. The value of each entry $x_i$ in the sparse signal vector x is taken from a finite set $Q=\{X_0=0, X_1, \ldots, X_{Q-1}\}$ with $X_q$ a non-zero figure, for $q=1\sim Q-1$, and Q the size of the set. Suppose that each entry $x_i$ has a probability $p_0$ of being "0" and a probability $p_q$ ($q=1\sim Q-1$) of being $X_q$. Since x is sparse, $$p_0 \gg \sum_{q=1}^{Q-1} p_q.$$

Based on the theory of compressive sensing, x can be recovered from the measurement vector y as below, $$y = Ax + n \quad (1)$$

wherein, n is a length-M noise vector with zero mean and $E(|n|^2) \leq M\sigma^2$ In this embodiment, the measurement matrix A is designed as follows:

$$A = \begin{bmatrix} A_1 \Pi_1 \\ \vdots \\ A_d \Pi_d \\ \vdots \\ A_D \Pi_D \end{bmatrix} \quad (2)$$

wherein $A_d \Pi_d$ (d=1~D) is a sub-matrix of the measurement matrix A, $\Pi_d$ is a N×N random permutation matrix, and $A_d$ is an J×N matrix which is designed as follows:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix} \quad (3)$$

wherein J*L=N, the measurement symbols generated from the same permutation matrix are referred to as one dimension, and the D is the total dimension number. The permutation matrices $\{\Pi_d\}$ are independently and randomly generated for D dimensions. The non-zero entries in $\{A_d\}$ are Gaussian random variables.

The encoding process can be implemented as follows. The source symbols in the digital sparse signal vector x are independently permutated D times. Every permutated version is divided into J=N/L groups, each containing L symbols. The symbols in the jth group of the dth permutated version are weighted by the corresponding non-zero entries in the jth row of $A_d$, and then linearly superimposed to generate the jth measurement symbol in this dimension. The number of total measurements M is determined by the group length L, the dimension number D, and the signal length N as M=ND/L.

After encoding, a quantization process is applied to digitalize the measurement symbols. The quantization error is represented by the noise vector n in formula (1). Let S denote the number of quantization levels, and $P_{quan}(s)$ the probability that a measurement symbol is quantized to level-S. The number of bits needed to represent one quantized measurement is then $$b = \sum_{s=1}^{S} p_{quan}(s) \cdot \log_2(1/p_{quan}(s)) \quad (4)$$

Thus the total number of bits needed to represent x is B=bM=bND/L, and the average number of bits needed per source symbol is $$\eta = \frac{B}{N} = bD/L \quad (5)$$

The average bit number per source symbol can be adjusted via the selection of D, L and S.

The structure of $\{A_d\}$ in formula (3) enables us to use maximum likelihood detection (ML) for each group of L symbols in each dimension. By choosing small values for L, the computational complexity of ML detection can be controlled. ML detection can fully exploit the digital nature of the source signal, and provide a locally optimal solution for each dimension. The multi-dimensional structure allows the iterative information exchange between dimensions to achieve a near global-optimal estimation. The independent random permutation matrices in different dimensions guarantee that statistically each measurement can provide (directly or indirectly) some useful information to all symbols in the digital sparse signal vector x, as the symbols contributing to different measurements in one dimension might be group together and contribute to the same measurement in other dimensions. This means that the information provided by one measurement to its associated L symbols might help the detection of other symbols if these L symbols are group with other symbols in other dimensions. Such a property is fully exploited in the iterative recovery algorithm to greatly enhance the noise-resistance ability of the proposed technique.

Figure 2:
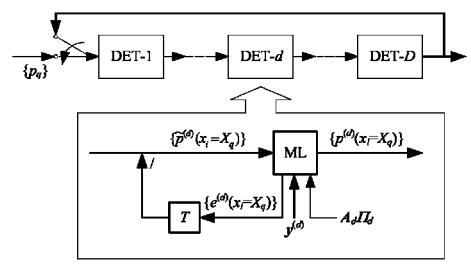
FIG. 2 shows the principle of the interactive algorithm used in FIG. 1.

Based thereon, in Step S12, D maximum likelihood detectors are used to respectively perform maximum likelihood detection for D dimensions. That is to say, each maximum likelihood detector is responsible for the detection of one dimension, as shown in FIG. 2. FIG. 2 shows the principle of the interactive algorithm, where "DET-d" is the local detector of the dth dimension, "T" denotes a delay of one iteration and "/" denotes the division operation.

Within each local detector, the ML detection is performed to each group of L symbols based on their noisy measurement symbol and a priori information. The output of each detector is a posteriori information of the source symbols in the digital sparse signal vector x, which is used to refine the local detection in other dimensions in the next iteration.

The variables involved in FIG. 2 are defined as follows.
$\tilde{p}^{(d)}(x_i = X_q)$: The a priori probability of $x_i$ being $X_q$ ($q=0\sim Q-1$) in the dth dimension.
$p^{(d)}(x_i = X_q)$: The a posteriori probability of $x_i$ being $X_q$ ($q=0\sim Q-1$) in the dth dimension.
$e^{(d)}(x_i = X_q)$: The extrinsic probability of $x_i$ being $X_q$ ($q=0\sim Q-1$) in the dth dimension.

The a priori probabilities are initialized as $\tilde{p}^{(1)}(x_i=X_q)=p_q$ for i=1~N and q=0~Q-1 in the first iteration, and the extrinsic probabilities wherein initialized as $e^{(d)}(x_i=X_q)=1$ for $\forall$ d in the first iteration.

Consider a particular measurement-j in the dth dimension, denoted by $y_j^{(d)}$. Let $\{i_{j,l}^{(d)}, l=1\sim L\}$ be the indices of the L source symbols that contribute to $y_j^{(d)}$. The values of $\{i_{j,l}^{(d)}, \forall j,l\}$ are determined by the permutation matrix $\Pi_d$. The a posteriori probabilities of these L symbols are calculated using the ML detection as $$p^{(d)}\left(x_{i_{j,l}^{(d)}} = X_q\right) = \frac{1}{\sqrt{2\pi\sigma^2}} \sum_{\substack{c \in Q^L \\ c_l = X_q}} \exp \quad (6)$$

$$\left\{-\frac{\left|y_j^{(d)} - \sum_{l'=1}^{L} a_{j,l'}^{(d)} c_{l'}\right|^2 \cdot \prod_{l'=1}^{L} \tilde{p}^{(d)}\left(x_{i_{j,l'}^{(d)}} = c_{l'}\right)}{2\sigma^2}\right\}, \text{ for } l = 1 \sim L$$

The summation in formula (6) is over all possible vectors $c \in Q^L$ with the lth element fixed to $X_q$. The extrinsic probabilities are calculated by extracting the a priori probabilities from the a posteriori probabilities, $$e^{(d)}(x_i = X_q) = p^{(d)}(x_i = X_q)/\tilde{p}^{(d)}(x_i = X_q) \quad (7)$$

The a posteriori probabilities generated in the dth dimension are used to update the a priori probabilities in the (mod(d, D)+1)th dimension as $$\tilde{p}^{(mod(d,D)+1)}(x_i = X_q) = p^{(d)}(x_i = X_q)/e^{(mod(d,D)+1)}(x_i = X_q) \quad (8)$$

Note that $e^{(mod(d,D)+1)}(x_i=X_q)$ is generated in the (mod(d, D)+1)th dimension in the previous iteration, so it should be prevented from circulating back to the (mod(d, D)+1)th dimension again, which is the basic rule of iterative detection. This is realized by the division operation in formula (8).

Then in the Step S13, repeating above procedure for a plurality of iterations until a predetermined condition is satisfied.

The predetermined condition may for example comprise any of the followings:
a fixed number of iterations has been reached;
the difference between the a posteriori probabilities generated in the Dth maximum likelihood detector in the two successive iterations is below a pre-defined threshold.

Last, in Step S14, the source symbols $\{x_i\}$ in the digital sparse signal vector x is estimated based on the output of the Dth maximum likelihood detector in the last iteration.

For example, hard decisions are made for source symbols $\{x_i\}$ as $$\hat{x}_i = X_{\hat{q}_i} \quad (9)$$

with $$\hat{q}_i = \arg\max_q(\{p^{(D)}(x_i = X_q) \,|\, q = 0 \sim Q-1\}) \quad (10)$$

The complexity of the above proposed iterative algorithm in this embodiment is $O(NDQ^L/L)$, which is much lower than that of the optimal solution $O(Q^N)$ as L is much smaller than N and does not grow with N. Notice that a smaller L will lead to a larger measurement number M for a fixed D. Then by adjusting the values of D and L, different tradeoffs between the computational complexity and measurement number can be achieved.

In the following text, the performance of above proposed technical solution is illustrated using numerical results. Considering binary source signals in the digital sparse signal vector X with $x_i \in \{0, 1\}$. The entries of X are i.i.d. variables with a probability $p_0(p_1)$ of being "0" ("1") and $p_0 \gg p_1$. The measurement matrix A is generated according to formula (2) and (3) with the non-zero entries i.i.d. Gaussian random variables with zero-mean and unit variance. The measurement matrix A is normalized such that each row has a unit norm. The quantization level is fixed to S=5 with the following quantization rule, where Quan(x) represents the value of X after quantization.

$$Quan(x) = \begin{cases} -0.6, & \text{if } x < -0.4 \\ -0.2, & \text{if } -0.4 \le x < 0 \\ 0, & \text{if } x = 0 \\ 0.2, & \text{if } 0 < x \le 0.4 \\ 0.6, & \text{if } 0.4 < x \end{cases} \quad (11)$$

Note that with a digital sparse signal vector X, the linear measurement symbols generated using the measurement matrix A defined in formula (2) and (3) (before quantization) have a large probability of being "0". If a zero measurement symbol appears, we can conclude with a high accuracy that all L source symbols associated with it are zero, which will be very helpful for the detection of other source symbols in the iterative recovery algorithm. Thus, a specific quantization level for "0" in formula (20) is used to distinguish it from other values. We use Monte Carlo simulation to obtain the probabilities $\{p_{quan}(s), s=1\sim5\}$ and calculate the average number of bits needed per source symbol η according to formula (5).

Figure 3A:
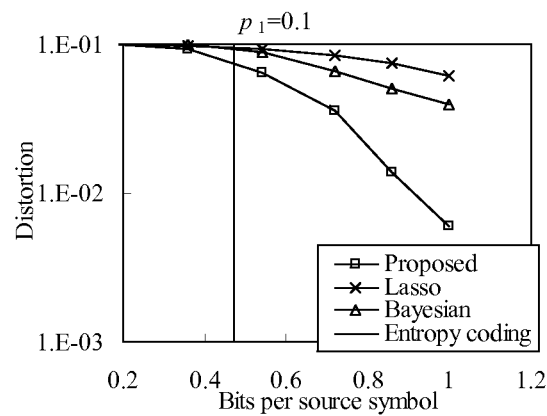
FIG. 3a shows the comparison of the rate-distortion performance between the embodiment of FIG. 1 and two conventional techniques with $p_1=0.1$.
Figure 3B:
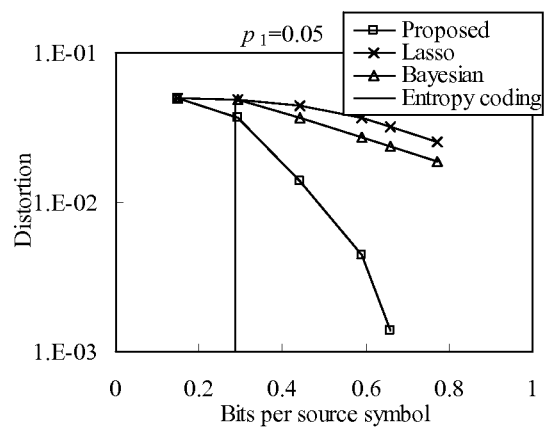
FIG. 3b shows the comparison of the rate-distortion performance between the embodiment of FIG. 1 and two conventional techniques with $p_1=0.05$.

FIGS. 3*a* and 3*b* show the comparison of the rate-distortion performance between the above proposed technical solution and two conventional techniques based on random Gaussian sensing matrix, Lasso algorithm and Bayesian framework, respectively. The minimum number of bits needed per source symbol for lossless recovery is also shown for reference.

Here, set $p_1 = 0.1$ and 0.05, and fix the iteration number at 5. The probabilities $\{p_{quan}(s)\}$ are listed in Table 1.

TABLE 1

The probabilities of $\{p_{quan}(s)\}$ after quantization.

| | | | $p_{quan}(1)$ (x < −0.4) | $p_{quan}(2)$ (−0.4 < x < 0) | $p_{quan}(3)$ (x = 0) | $p_{quan}(4)$ (0 < x < 0.4) | $p_{quan}(5)$ (0.4 < x) |
|---|---|---|---|---|---|---|---|
| $p_1 = 0.1$ | proposed | L = 10 | 0.0999 | 0.2321 | 0.3341 | 0.2325 | 0.1014 |
| | | L = 12 | 0.0967 | 0.2665 | 0.2656 | 0.2685 | 0.1027 |
| | conventional | | 0.1048 | 0.3952 | 0 | 0.3966 | 0.1034 |
| $p_1 = 0.05$ | proposed | L = 10 | 0.0527 | 0.1528 | 0.5873 | 0.153 | 0.0542 |
| | | L = 12 | 0.0503 | 0.1845 | 0.5253 | 0.187 | 0.0529 |
| | conventional | | 0.0364 | 0.4642 | 0 | 0.4629 | 0.0365 |

From the table 1, the number of bits needed per source symbol η can be calculated. Adjust D from 1 to 4 and L from 10 to 12 to obtain different values of η from 0.14 to 1. The distortion, denoted by ξ, is measured as follows, which equals the average number of incorrect entries in $\hat{x} = \{\hat{x}_i\}$ normalized by N.

$$\xi = \frac{1}{N} E(\|\hat{x} - x\|_2^2) \tag{12}$$

For reference, it is shown in FIG. 3 the minimum number of bits needed per source symbol for lossless compression via entropy coding. The rate-distortion performances of two conventional approaches are also included, which are based on random Gaussian sensing matrices, and employ convex relaxation (please refer to [R. Gribonval and M. Nielsen, "Highly sparse representations from dictionaries are unique and independent of the sparseness measure," Aalborg Univ., Aalborg, Denmark, Tech. Rep., October 2003.], and [J. A. Tropp, "Just relax: Convex programming methods for identifying sparse signals in noise," IEEE Trans. Inf. Theory, vol. 52, no. 3, pp. 1030-1051, March 2006.] for details), and Bayesian framework (please refer to [S. Ji, Y. Xue and L. Carin, "Bayesian compressive sensing," IEEE Trans. Signal Processing, vol. 56, no. 6, pp. 2346-2356, June 2008.], and [M. E. Tipping, "Sparse Bayesian learning and the relevance vector machine," Journal of Machine Learning Research, vol. 1, pp. 211-244, September 2001.] for details), respectively, for signal recovery. For convex relaxation, we use the Lasso algorithm (please refer to [M. J. Wainwright, "Sharp thresholds for high-dimensional and noisy sparsity recovery using l1-constrained quadratic programming (Lasso)," IEEE Trans. on Inform. Theory, vol. 55, pp. 2183-2202, May 2009.], and [R. Tibshirani, "Regression shrinkage and selection via the lasso," Journal of the Royal Statistical Society, Series B, pp. 267-288, 1996.] for details). For the Bayesian framework based algorithm, the technique introduced in the paper {S. Ji, Y. Xue and L. Carin, "*Bayesian compressive sensing*," IEEE Trans. Signal Processing, vol. 56, no. 6, pp. 2346-2356, June 2008.' } is used. Both conventional approaches use a similar quantization rule as in formula (11) except removing the quantization level dedicated to "0", as in this case each measurement is very unlikely to be "0". The probabilities $\{p_{quan}(s), s=1\sim 5\}$ for the conventional approaches are also listed in Table 1. From FIG. 3, it is observed that the proposed technique can achieve much better rate-distortion performance than the conventional approaches based on random sensing matrix and convex relaxation/Bayesian framework.

Figure 4:
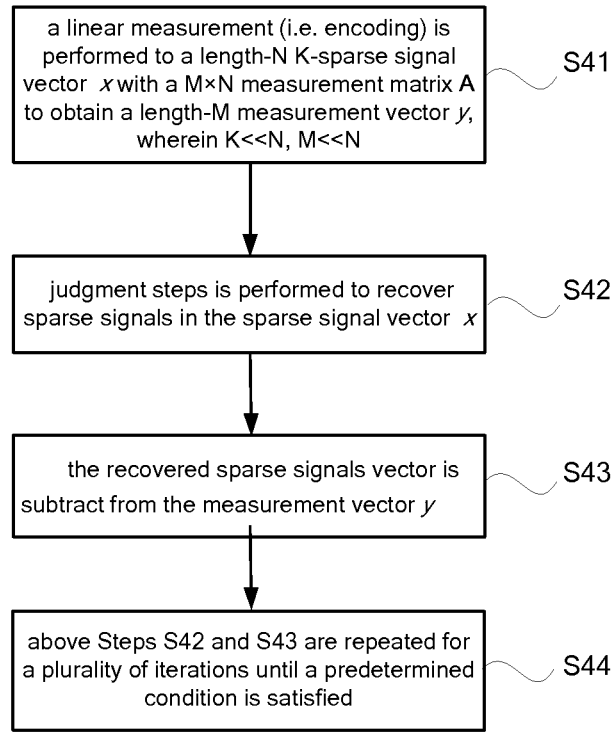
FIG. 4 shows a flowchart of processing analog sparse signals according to another embodiment.

FIG. 4 shows a flowchart of processing analog sparse signals according to another embodiment.

In Step S41, a linear measurement (i.e. encoding) is performed to a length-N K-sparse signal vector x with a M×N measurement matrix A to obtain a length-M measurement vector y, wherein K<<N, M<<N, and the K-sparse signal vector $x = \{x_i\} \in \Re^N$, the measurement vector $y \in \Re^M$.

According to the theory of compressive sensing, x can be recovered from the measurement vector y as below, $$y = Ax \tag{13}$$

In this embodiment, the measurement matrix A is designed as follows:

$$A = \begin{bmatrix} A_1 \Pi_1 \\ \vdots \\ A_d \Pi_d \\ \vdots \\ A_D \Pi_D \end{bmatrix} \tag{14}$$

wherein $A_d \Pi_d (d=1\sim D)$ is a sub-matrix of the measurement matrix A, $\Pi_d$ is a N×N random permutation matrix, and $A_d$ is an J×N matrix which designed as follows:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix} \tag{15}$$

wherein J*L=N, the measurement symbols generated from the same permutation matrix are referred to as one dimension, and the D is the total dimension number. Clearly, the measurement matrix A generated in this way is sparse with only D non-zero entries per column.

The encoding operation can be implemented as follows. The source symbols in the digital sparse signal vector x are independently permutated D times. Every permuted version is divided into J=N/L groups, each containing L symbols. The symbols in the jth group of the dth permutated version are weighted by the corresponding non-zero entries in the jth row of $A_d$, and then linearly superimposed to generate the jth measurement in this dimension. Denote by $y_j^{(d)}$ (j=1~J) the jth measurement symbol in the dth dimension, which have $$y_j^{(d)} = \sum_{l=1}^{L} a_{j,l}^{(d)} \hat{x}_{(j-1)L+l}^{(d)} \quad (16)$$

where $\hat{x}^{(d)} = \{\hat{x}_i^{(d)}, i=1\sim N\}$ is the dth permutated version of x. Let $\Pi_d(i)$ be the index of $x_i$ in the dth permutated version and $\Pi_d^{-1}(i)$ the inverse operation, which have $$\hat{x}_{\Pi_d(i)}^{(d)} = x_i \text{ and } \hat{x}_i^{(d)} = x_{\Pi_d^{-1}(i)} \quad (17)$$

Every source symbol $x_i$ in the sparse signal vector X is associated with D measurements, each in one dimension. The total measurements number (i.e. sketch length) M is determined by the group length L, the dimension number D, and the source signal length N as M=ND/L.

From formula (16), it can be seen that the measurement matrix A has only D non-zero elements in each column. Also note that only non-zero elements of x lead to addition and multiplication operations in encoding. Therefore, the encoding complexity of the proposed technique is about DK multiplications and DK additions.

The block diagonal structure of $\{A_d\}$ in formula (15) and the random permutation matrices in D dimensions lead to the following features of the measurement symbols, which are very useful in signal recovery. For the convenience of discussion, it is defined the degree of a measurement symbol as the number of non-zero source symbols associated with it. From (16) it can be seen that each measurement symbol $y_j^{(d)}$ is associated with only L source symbols $\{\hat{x}_{(j-1)L+l}^{(d)}, l=1\sim L\}$, therefore it is easy to verify that the following two issues have relatively large probabilities to happen.

Issue-1: A measurement symbol has a degree of 0.
Issue-2: For a non-zero source symbol, at least two of its associated measurements have a degree of 1 (assume D≥2).

The probabilities of the above two issues can be calculated as follows. Let $p_1 = K/N$, and $p_0 = 1-p_1$. $p_1$ and $p_0$ represent the probabilities of a source symbol being non-zero and zero, respectively. Then the probabilities of issue-1 and issue-2 can be approximately calculated as $$P_{issue-1} \approx p_0^L = \left(\frac{N-K}{N}\right)^L \quad (18)$$

and $$P_{issue-2} \approx \sum_{m=2}^{D} \binom{D}{m} (p_0^{(L-1)})^m (1 - p_0^{(L-1)})^{(D-m)} =$$
$$\sum_{m=2}^{D} \binom{D}{m} \left(\frac{N-K}{N}\right)^{m(L-1)} \left(1 - \left(\frac{N-K}{N}\right)^{(L-1)}\right)^{(D-m)} \quad (19)$$

It is easy to see that when K<<N, the two probabilities can be made relatively large by selecting proper values for L and D. For example, when K=100, N=1000, L=10, and D=4, $P_{issue-1}$=34.87% and $P_{issue-2}$=50.29%.

In the case of issue-1, the measurement symbol is zero. Also notice that if a measurement symbol is associated with one or more non-zero source symbols, these non-zero symbols are very unlikely to complete cancel each other (see formula (16)), so the measurement symbol has a probability close to 1 of being non-zero. Therefore if a zero measurement symbol appears, it can be deduced that all source symbols associated with it are zeros.

In the case of issue-2, the two 1-degree measurements of the non-zero source symbol are related as follows. Suppose that a non-zero source symbol $x_i$ has two 1-degree measurements in dimensions $d_1$ and $d_2$. Denote $j_i^{(d_m)} = \lceil \Pi_{d_m}(i)-1 \rceil / L$ and $l_i^{(d_m)} = \mathrm{mod}(\Pi_{d_m}(i)-1, L)+1$ for m=1 and 2. The values of these two 1-degree measurements have the following relationship $$x_i = \frac{y_{j_i^{(d_1)}}^{(d_1)}}{a_{j_i^{(d_1)},l_i^{(d_1)}}^{(d_1)}} = \frac{y_{j_i^{(d_2)}}^{(d_2)}}{a_{j_i^{(d_2)},l_i^{(d_2)}}^{(d_2)}} \quad (20)$$

Clearly the value of $x_i$ can be calculated from formula (20).

Based on the above discussion of issues 1 and 2, then in Step S42, for each element $\tilde{y}_j^{(d)}$ in $\tilde{y}$ (d=1~D, j=1~J), it is judged whether the $\tilde{y}_j^{(d)}$ equals to 0; and if the $\tilde{y}_j^{(d)}$ equals to 0, setting $x_{\Pi_d^{-1}((j-1)L+l)} = 0$, for l=1~L, wherein $\tilde{y}$ is initialized as $\tilde{y}=y$; and for each source symbol $x_i$ in the sparse signal vector x, for i=1~N, it is judged whether the following equation is satisfied, $$\frac{\tilde{y}_{j_i^{(d_m)}}^{(d_m)}}{a_{j_i^{(d_m)},l_i^{(d_m)}}^{(d_m)}} = \frac{\tilde{y}_{j_i^{(d_n)}}^{(d_n)}}{a_{j_i^{(d_n)},l_i^{(d_n)}}^{(d_n)}}, \forall d_m=1\sim D, d_n=1\sim D, d_m \neq d_n \quad (21)$$

and if it is satisfied for a pair of ($d_m$, $d_n$), setting $$x_i = \frac{\tilde{y}_{j_i^{(d_m)}}^{(d_m)}}{a_{j_i^{(d_m)},l_i^{(d_m)}}^{(d_m)}}.$$

Then in Step S43, $\tilde{y}$ is updated by subtracting the recovered sparse signals from the measurement vector y, by following formula:

$$\tilde{y} = y - A\tilde{x} \quad (22)$$

wherein $\tilde{x}$ represents the recovered sparse signal vector, in which the un-recovered symbols are set to 0.

Such an interference cancellation operation will help the recovery of other symbols in two ways. Firstly, if a measurement symbol has all but one associated source symbols recovered, then the only un-recovered source symbol can be directly estimated from the measurement (after interference cancellation). Secondly, if a non-zero source symbol is subtracted from y, the degrees of its associated measurements are decreased by 1. This might introduce new cases of issues 1 and 2 in $\tilde{y}$, so the above two rules can be applied again to re-generate more source symbols from $\tilde{y}$. This motivates the use of an iterative process along with interference cancellation to recursively recover x.

Then, in Step S44, above Steps S42 and S43 are repeated for a plurality of iterations until a predetermined condition is satisfied.

The predetermined condition may for example comprise any of the followings:
- a fixed number of iterations has been reached;
- successful recovery of all source symbols in the sparse signal vector;
- $\tilde{x}_{new} = \tilde{x}_{old}$, wherein $\tilde{x}_{old}$ and $\tilde{x}_{new}$ represent $\tilde{x}$ before and after one iteration.

The complexity of the above proposed iterative algorithm in this embodiment is O(N).

In the following text, the performance of above proposed technical solution is illustrated using numerical results. Consider sparse source signals x with Gaussian random variables as non-zero elements. The measurement matrix A is generated according to formula (14) and (15), with Gaussian random variables as non-zero entries. In the simulation, set $p_1 = K/N = 0.1$ and 0.05, and the dimension number $D=4$. The group length L is adjusted to get different sketch lengths M. The iterative recovery process is terminated when any one of the following three conditions is met: a) $T=20$ iterations are researched; b) all source symbols have been successfully recovered; c) $\tilde{x}_{new} = \tilde{x}_{old}$ with $\tilde{x}_{old}$ and $\tilde{x}_{new}$ the version of $\tilde{x}$ before and after one iteration. The average iteration number is $T_{ave} = 6 \sim 10$, depending on M/N.

Figure 5:
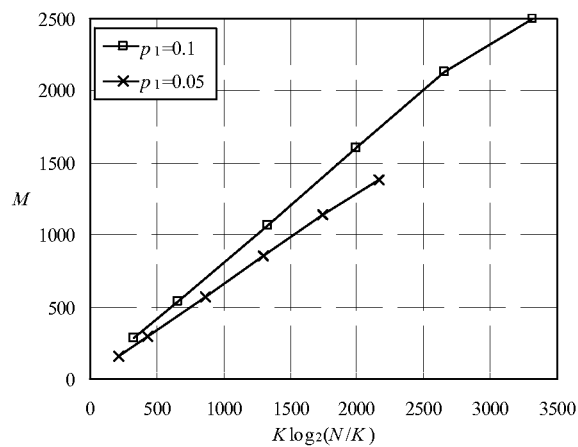
FIG. 5 shows the relationship between the measurement number M and $K \log_2(N/K)$ of the embodiment of FIG. 4.

FIG. 5 shows the relationship between the measurement number M and $K \log_2(N/K)$. The purpose of this figure is to show that the proposed technique can achieve the lower bound of the sketch length $O(K \log 2(N/K))$. It is shown in FIG. 5 that for the above proposed technical solution, the required number of measurements M grows linearly with the signal length N. Here, set N from 1000 to 10000, and M is selected to guarantee a recovery failure probability no larger than 0.01. Note that a recovery failure occurs when $\|\tilde{x}_{final} - x\|_2^2 / \|x\|_2^2 > 10^{-2}$, where $\tilde{x}_{final}$ denotes $\tilde{x}$ after the final iteration. FIG. 5 clearly shows that the proposed technical solution can empirically achieve the sketch length lower bound of $\alpha \cdot K \log_2(N/K)$ with a very small value of $\alpha$ around $0.6 \sim 0.8$.

Figure 6A:
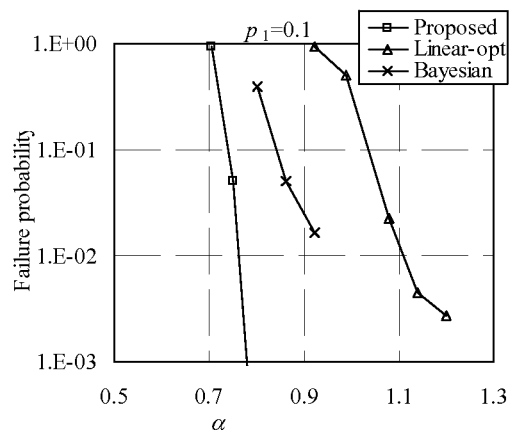
FIG. 6a shows the relationship between the recovery failure probability and α of the embodiment of FIG. 4 with $p_1=0.1$.
Figure 6B:
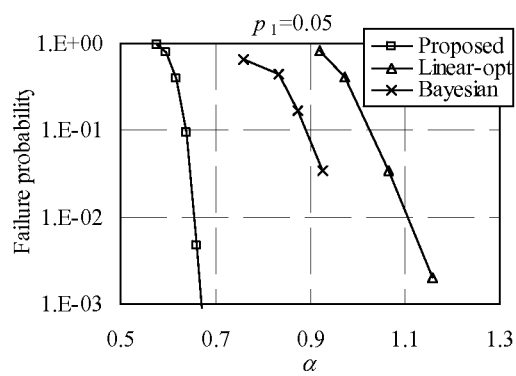
FIG. 6b shows the relationship between the recovery failure probability and α of the embodiment of FIG. 4 with $p_1=0.05$.

FIGS. 6a and 6b show the relationships between the recovery failure probability and $\alpha$ (i.e., the sketch length) for the above proposed technical solution. Here, fix $N=4000$ and change $\alpha$ from $0.5 \sim 1.2$. For comparison, it is also shown in FIG. 6 the recovery failure probability for existing recovery algorithms based on $l_1$ magic and Bayesian framework. As it is can be seen, to achieve the same recovery accuracy, the above proposed technical solution requires much less measurements than the $l_1$ magic and Bayesian framework. Such a good sketch length is achieved with a linear complexity. The good empirical performance and linear recovery complexity make the proposed technique a potential and attractive solution to compressive sensing with sparse matrices.

The technical solution of the invention has been described above from the perspective of methods, and hereinafter the technical solution of the invention will be further described from the perspective of apparatus.

According to one embodiment of the invention, there is further provided an apparatus for measuring and recovering sparse signals. The apparatus comprises: a measuring means, for performing a linear measurement to a length-N sparse signal vector $x = \{x_i\}$ with a M×N measurement matrix A to obtain a length-M measurement vector y, wherein the measurement matrix A is denoted by:

$$A = \begin{bmatrix} A_1 \Pi_1 \\ \vdots \\ A_d \Pi_d \\ \vdots \\ A_D \Pi_D \end{bmatrix}$$

wherein $A_d \Pi_d$ is a sub-matrix of the measurement matrix A, for $d = 1 \sim D$, $\Pi_d$ is a N×N random permutation matrix, and $A_d$ is an J×N matrix which is denoted by:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix}$$

wherein $M \ll N$, $J*L=N$, the measurement symbols generated from the same permutation matrix are referred to as one dimension, and the D is the total dimension number; and a recovering means, for recovering the length-N sparse signal vector $x = \{x_i\}$ from the length-M measurement vector y.

Advantageously, when the sparse signals are digital sparse signals and each entry $x_i$ in the sparse signal vector x is taken from a finite set $Q = \{X_0 = 0, X_1, \ldots, X_{Q-1}\}$ with $X_q$ a non-zero figure, for $q = 1 \sim Q-1$, and Q the size of the set, the recovering means may further comprise: a detecting means including D maximum likelihood detectors, for respectively performing maximum likelihood detection for D dimensions, wherein the dth maximum likelihood detector is used for performing maximum likelihood detection for the dth dimension; wherein the detecting means repeats above detection for a plurality of iterations until a predetermined condition is satisfied; and an estimating means, for estimating the source symbols in the sparse signal vector based on the output of the Dth maximum likelihood detector in the last iteration.

To be specific, for the dth dimension, the dth maximum likelihood detector in the detecting means is used for performing a maximum likelihood detection, based on the measurement symbols of the dth dimension and a prior information in the dth dimension, to generate a posterior information of the source symbols in the sparse signal vector, wherein the a posterior information generated in the dth dimension is used for updating a prior information in the $(\mod(d, D)+1)$th dimension.

Preferably, the a posterior information $p^{(d)}(x_i = X_q)$ in the dth dimension is used for updating the a prior information $\tilde{p}^{(\mod(d,D)+1)}(x_i = X_q)$ in the $(\mod(d, D)+1)$th dimension, by following formula:

$$\tilde{p}^{(\mod(d,D)+1)}(x_i = X_q) = p^{(d)}(x_i = X_q) / e^{(\mod(d,D)+1)}(x_i = X_q)$$

wherein the $e^{(\mod(d,D)+1)}(x_i = X_q)$ is generated in the $(\mod(d, D)+1)$th dimension in the previous iteration, which represents the extrinsic probability of $x_i$ being $X_q$ in the $(\mod(d, D)+1)$th dimension, for $q = 0 \sim Q-1$, the $e^{(\mod(d,D)+1)}(x_i = X_q)$ is initialized as 1 in the first iteration, and $e^{(\mod(d,D)+1)}(x_i = X_q) = p^{(\mod(d,D)+1)}(x_i = X_q) / \tilde{p}^{(\mod(d,D)+1)}(x_i = X_q)$.

The predetermined condition may for example comprise any of the followings:

a fixed number of iterations has been reached;

the difference between the a posteriori probabilities generated in the Dth maximum likelihood detector in the two successive iterations is below a pre-defined threshold.

Advantageously, when the sparse signals are analog sparse signals, the recovering means may further comprise:

a judging means, for, for each element $\tilde{y}_j^{(d)}$ in $\tilde{y}$, for $d = 1 \sim D$, $j = 1 \sim J$, judging whether the $\tilde{y}_j^{(d)}$ equals to 0, wherein $\tilde{y}$ is initialized as $\tilde{y} = y$;

and if the $\tilde{y}_j^{(d)}$ equals to 0, setting $x_{\Pi_d^{-1}((j-1)L+l)} = 0$, for $l = 1 \sim L$;

wherein $\Pi_d(i)$ is the index of $x_i$ in the dth permuted version and $\Pi_d^{-1}(i)$ the inverse operation of $\Pi_d(i)$; and for each source symbol $x_i$ in the sparse signal vector x, for $i = 1 \sim N$, judging whether the following equation is satisfied, $$\frac{\tilde{y}_{j_i^{(d_m)}}^{(d_m)}}{a_{j_i^{(d_m)},l_i^{(d_m)}}^{(d_m)}} = \frac{\tilde{y}_{j_i^{(d_n)}}^{(d_n)}}{a_{j_i^{(d_n)},l_i^{(d_n)}}^{(d_n)}}, \forall d_m = 1 \sim D, d_n = 1 \sim D, d_m \neq d_n;$$

and if it is satisfied for a pair of $(d_m, d_n)$, setting $$x_i = \frac{\tilde{y}_{j_i^{(d_m)}}^{(d_m)}}{a_{j_i^{(d_m)},l_i^{(d_m)}}^{(d_m)}};$$

wherein $j_i^{(d_m)} = \lfloor (\Pi_{d_m}(i)-1)/L \rfloor$ and $l_i^{(d_m)} = \mathrm{mod}(\Pi_{d_m}(i)-1, L)+1$;

and an updating means, for updating $\tilde{y}$ by subtracting the recovered sparse signals from the measurement vector y, by following formula:

$$\tilde{y} = y - A\tilde{x}$$

wherein $\tilde{x}$ represents the recovered sparse signal vector, in which the un-recovered symbols are set to 0;

wherein the judging means repeats above judgments for a plurality of iterations until a predetermined condition is satisfied.

The predetermined condition may for example comprise any of the followings:
- a fixed number of iterations has been reached;
- successful recovery of all source symbols in the sparse signal vector;
- $\tilde{x}_{new} = \tilde{x}_{old}$, wherein $\tilde{x}_{old}$ and $\tilde{x}_{new}$ represent $\tilde{x}$ before and after one iteration.

It should be noted that the above described embodiments are given for describing rather than limiting the invention, and it is to be understood that modifications and variations may be resorted to without departing from the spirit and scope of the invention as those skilled in the art readily understand. Such modifications and variations are considered to be within the scope of the invention and the appended claims. The protection scope of the invention is defined by the accompanying claims. In addition, any of the reference numerals in the claims should not be interpreted as a limitation to the claims. Use of the verb "comprise" and its conjugations does not exclude the presence of elements or steps other than those stated in a claim. The indefinite article "a" or "an" preceding an element or step does not exclude the presence of a plurality of such elements or steps.

What is claimed is:

1. A method for measuring and recovering sparse signals comprising:
   a. performing a linear measurement to a length-N sparse signal vector $x=\{x_i\}$ with a M×N measurement matrix A to obtain a length-M measurement vector y, wherein the measurement matrix A is denoted by:

$$A = \begin{bmatrix} A_1 \Pi_1 \\ \vdots \\ A_d \Pi_d \\ \vdots \\ A_D \Pi_D \end{bmatrix}$$

wherein $A_d \Pi_d$ is a sub-matrix of the measurement matrix A, for $d=1\sim D$, $\Pi_d$ is a N×N random permutation matrix, and $A_d$ is an J×N matrix which is denoted by:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix}$$

wherein M<<N, J*L=N, the measurement symbols generated from the same permutation matrix are referred to as one dimension, and the D is the total dimension number; and
   b. recovering the length-N sparse signal vector $x=\{x_i\}$ from the length-M measurement vector y.

2. A method according to claim 1, wherein when the sparse signals are digital sparse signals and each entry $x_i$ in the sparse signal vector x is taken from a finite set $Q=\{X_0=0, X_1, \ldots, X_{Q-1}\}$ with $X_q$ a non-zero figure, for $q=1<Q-1$, and Q the size of the set, the step b comprises:
   b1. using D maximum likelihood detectors to respectively perform maximum likelihood detection for D dimensions, wherein the dth maximum likelihood detector is used for performing maximum likelihood detection for the dth dimension;
   b2. repeating step b1 for a plurality of iterations until a predetermined condition is satisfied;
   b3. estimating the source symbols in the sparse signal vector based on the output of the Dth maximum likelihood detector in the last iteration.

3. A method according to claim 2, wherein the step b1 comprises:
   for the dth dimension, performing a maximum likelihood detection, based on the measurement symbols of the dth dimension and a prior information in the dth dimension, to generate a posterior information of the source symbols in the sparse signal vector, wherein the a posterior information generated in the dth dimension is used for updating a prior information in the $(\mathrm{mod}(d, D)+1)$th dimension.

4. A method according to claim 3, wherein the a posterior information $p^{(d)}(x_i=X_q)$ in the dth dimension is used for updating the a prior information $\tilde{p}^{(\mathrm{mod}(d,D)+1)}(x_i=X_q)$ in the $(\mathrm{mod}(d, D)+1)$th dimension, by following formula:

$$\tilde{p}^{(\mathrm{mod}(d,D)+1)}(x_i=X_q) = p^{(d)}(x_i=X_q)/e^{(\mathrm{mod}(d,D)+1)}(x_i=X_q)$$

wherein the $e^{(\mathrm{mod}(d,D)+1)}(x_i=X_q)$ is generated in the $(\mathrm{mod}(d, D)+1)$th dimension in the previous iteration, which represents the extrinsic probability of $x_i$ being $X_q$ in the $(\mathrm{mod}(d, D)+1)$th dimension, for $q=0\sim Q-1$, the $e^{(\mathrm{mod}(d,D)+1)}(x_i=X_q)$ is initialized as 1 in the first iteration, and updated in the following iterations as $e^{(\mathrm{mod}(d,D)+1)}(x_i=X_q) = p^{(\mathrm{mod}(d,D)+1)}(x_i=X_q)/\tilde{p}^{(\mathrm{mod}(d,D)+1)}(x_i=X_q)$.

5. A method according to claim 2, wherein the predetermined condition comprises any of the followings:
   a fixed number of iterations has been reached;
   the difference between the a posteriori probabilities generated in the Dth maximum likelihood detector in the two successive iterations is below a pre-defined threshold.

6. A method according to claim 1, wherein when the sparse signals are analog sparse signals, the method b comprises:
   i. for each element $\tilde{y}_j^{(d)}$ in $\tilde{y}$, for $d=1\sim D, j=1\sim J$, judging whether the $\tilde{y}_j^{(d)}$ equals to 0, wherein $\tilde{y}$ is initialized as $\tilde{y}=y$, and $\tilde{y}_j^{(d)}$ is the jth element in the dth dimension of $\tilde{y}$;
   ii. if the $\tilde{y}_j^{(d)}$ equals to 0, setting $x_{\Pi_d^{-1}((j-1)L+l)}=0$, for $l=1\sim L$;

wherein $\Pi_d(i)$ is the index of $x_i$ in the dth permutated version and $\Pi_d^{-1}(i)$ the inverse operation of $\Pi_d(i)$;

and the method further comprise:

u. for each source symbol $x_i$ in the sparse signal vector $x$, for i=1~N, judging whether the following equation is satisfied, $$\frac{\tilde{y}_{j_i^{(d_m)}}^{(d_m)}}{a_{j_i^{(d_m)},l_i^{(d_m)}}^{(d_m)}} = \frac{\tilde{y}_{j_i^{(d_n)}}^{(d_n)}}{a_{j_i^{(d_n)},l_i^{(d_n)}}^{(d_n)}}, \forall d_m = 1 \sim D, d_n = 1 \sim D, d_m \neq d_n;$$

v. if it is satisfied for a pair of ($d_m$, $d_n$), setting $$x_i = \frac{\tilde{y}_{j_i^{(d_m)}}^{(d_m)}}{a_{j_i^{(d_m)},l_i^{(d_m)}}^{(d_m)}};$$

wherein $j_i^{(d_m)} = \lfloor(\Pi_{d_m}(i)-1)/L\rfloor$ and $l_i^{(d_m)} = \mod(\Pi_{d_m}(i)-1, L)+1$;

and after above steps, the method further comprises:

p. updating $\tilde{y}$ by subtracting the recovered sparse signals from the measurement vector y, by following formula:

$$\tilde{y} = y - A\tilde{x}$$

wherein $\tilde{x}$ represents the recovered sparse signal vector, in which the un-recovered symbols are set to 0;

q. repeating above steps for a plurality of iterations until a predetermined condition is satisfied.

7. A method according to claim 6, wherein the predetermined condition comprises any of the followings:

a fixed number of iterations has been reached;

successful recovery of all source symbols in the sparse signal vector;

$\tilde{x}_{new} = \tilde{x}_{old}$ wherein $\tilde{x}_{old}$ and $\tilde{x}_{new}$ represent $\tilde{x}$ before and after one iteration.

8. An apparatus for measuring and recovering sparse signals comprising:

a measuring means, for performing a linear measurement to a length-N sparse signal vector $x=\{x_i\}$ with a M×N measurement matrix A to obtain a length-M measurement vector y, wherein the measurement matrix A is denoted by:

$$A = \begin{bmatrix} A_1\Pi_1 \\ \vdots \\ A_d\Pi_d \\ \vdots \\ A_D\Pi_D \end{bmatrix}$$

wherein $A_d\Pi_d$ is a sub-matrix of the measurement matrix A, for d=1~D, $\Pi_d$ is a N×N random permutation matrix, and $A_d$ is an J×N matrix which is denoted by:

$$A_d = \begin{bmatrix} a_{1,1}^{(d)} \ldots a_{1,L}^{(d)} & & 0 \\ & \ddots & \\ 0 & & a_{J,1}^{(d)} \ldots a_{J,L}^{(d)} \end{bmatrix}$$

wherein M<<N, J*L=N, the measurement symbols generated from the same permutation matrix are referred to as one dimension, and the D is the total dimension number; and a recovering means, for recovering the length-N sparse signal vector $x=\{x_i\}$ from the length-M measurement vector y.

9. An apparatus according to claim 8, wherein when the sparse signals are digital sparse signals and each entry $x_i$ in the sparse signal vector x is taken from a finite set $Q=\{X_0=0, X_1, \ldots, X_{Q-1}\}$ with $X_q$ a non-zero figure, for q=1~Q-1, and Q the size of the set, the recovering means comprises:

a detecting means including D maximum likelihood detectors, for respectively performing maximum likelihood detection for D dimensions, wherein the dth maximum likelihood detector is used for performing maximum likelihood detection for the dth dimension;

wherein the detecting means repeats above detection for a plurality of iterations until a predetermined condition is satisfied;

an estimating means, for estimating the source symbols in the sparse signal vector based on the output of the Dth maximum likelihood detector in the last iteration.

10. An apparatus according to claim 9, wherein for the dth dimension, the dth maximum likelihood detector in the detecting means is used for performing a maximum likelihood detection, based on the measurement symbols of the dth dimension and a prior information in the dth dimension, to generate a posterior information of the source symbols in the sparse signal vector, wherein the a posterior information generated in the dth dimension is used for updating a prior information in the (mod(d, D)+1)th dimension.

11. An apparatus according to claim 10, wherein the a posterior information $p^{(d)}(x_i=X_q)$ in the dth dimension is used for updating the a prior information $\tilde{p}^{(mod(d,D)+1)}(x_i=X_q)$ in the (mod(d, D)+1)th dimension, by following formula:

$$\tilde{p}^{(mod(d,D)+1)}(x_i=X_q) = p^{(d)}(x_i=X_q)/e^{(mod(d,D)+1)}(x_i=X_q)$$

wherein the $e^{(mod(d,D)+1)}(x_i=X_q)$ is generated in the (mod(d, D)+1)th dimension in the previous iteration, which represents the extrinsic probability of $x_i$ being $X_q$ in the (mod(d, D)+1)th dimension, for q=0~Q-1, the $e^{(mod(d,D)+1)}(x_i=X_q)$ is initialized as 1 in the first iteration, and updated in the following iterations as $e^{(mod(d,D)+1)}(x_i=X_q) = p^{(mod(d,D)+1)}(x_i=X_q)/\tilde{p}^{(mod(d,D)+1)}(x_i=X_p)$.

12. An apparatus according to claim 9, wherein the predetermined condition comprises any of the followings:

a fixed number of iterations has been reached;

the difference between the a posteriori probabilities generated in the two successive iterations is below a predefined threshold.

13. An apparatus according to claim 8, wherein when the sparse signals are analog sparse signals, the recovering means comprises:

a judging means, for, for each element $\tilde{y}_j^{(d)}$ in $\tilde{y}$, for d=1~D, j=1~J, judging whether the $\tilde{y}_j^{(d)}$ equals to 0, wherein $\tilde{y}$ is initialized as $\tilde{y}=y$, and $\tilde{y}_j^{(d)}$ is the jth element in the dth dimension of $\tilde{y}$;

and if the $\tilde{y}_j^{(d)}$ equals to 0, setting $x_{\Pi_d^{-1}((j-1)L+l)}=0$, for l=1~L;

wherein $\Pi_d(i)$ is the index of $x_i$ in the dth permutated version and $\Pi_d^{-1}(i)$ the inverse operation of $\Pi_d(i)$; and for each source symbol $x_i$ in the sparse signal vector x, for i=1~N, judging whether the following equation is satisfied, $$\frac{\tilde{y}^{(d_m)}_{j_i^{(d_m)}}}{a^{(d_m)}_{j_i^{(d_m)},l_i^{(d_m)}}} = \frac{\tilde{y}^{(d_n)}_{j_i^{(d_n)}}}{a^{(d_n)}_{j_i^{(d_n)},l_i^{(d_n)}}}, \forall\, d_m = 1 \sim D, d_n = 1 \sim D, d_m \neq d_n;$$

and if it is satisfied for a pair of $(d_m, d_n)$, setting $$x_i = \frac{\tilde{y}^{(d_m)}_{j_i^{(d_m)}}}{a^{(d_m)}_{j_i^{(d_m)},l_i^{(d_m)}}};$$

wherein $j_i^{(d_m)} = \lfloor(\Pi_{d_m}(i)-1)/L\rfloor$ and $l_i^{(d_m)} = \mathrm{mod}(\Pi_{d_m}(i)-1, L)+1$;

an updating means, for updating $\tilde{y}$ by subtracting the recovered sparse signals from the measurement vector y, by following formula:

$$\tilde{y} = y - A\tilde{x}$$

wherein $\tilde{x}$ represents the recovered sparse signal vector, in which the un-recovered symbols are set to 0;

wherein the judging means repeats above judgments for a plurality of iterations until a predetermined condition is satisfied.

14. An apparatus according to claim 13, wherein the predetermined condition comprises any of the followings:

a fixed number of iterations has been reached;

successful recovery of all source symbols in the sparse signal vector;

$\tilde{x}_{new} = \tilde{x}_{old}$, wherein $\tilde{x}_{old}$ and $\tilde{x}_{new}$ represent $\tilde{x}$ before and after one iteration.

\* \* \* \* \*